United States Patent
Park

(10) Patent No.: US 6,864,179 B2
(45) Date of Patent: Mar. 8, 2005

(54) SEMICONDUCTOR MEMORY DEVICE HAVING COB STRUCTURE AND METHOD OF FABRICATING THE SAME

(75) Inventor: Byung-Jun Park, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 10/198,002

(22) Filed: Jul. 17, 2002

(65) Prior Publication Data

US 2003/0114007 A1 Jun. 19, 2003

(30) Foreign Application Priority Data

Dec. 15, 2001 (KR) .......................................... 2001-79690

(51) Int. Cl.[7] ........................................... H01L 21/302
(52) U.S. Cl. ...................... 438/694; 438/697; 438/699; 438/700; 438/703; 438/704
(58) Field of Search ................................ 438/694, 697, 438/699, 700, 703, 704

(56) References Cited

U.S. PATENT DOCUMENTS 6,159,820 A * 12/2000 Park ........................... 438/396
6,174,782 B1 * 1/2001 Lee ............................ 438/396

* cited by examiner

Primary Examiner—Duy-Vu N. Dee
Assistant Examiner—Binh X. Tran
(74) Attorney, Agent, or Firm—Marger Johnson & McCollom, P.C.

(57) ABSTRACT

A fabrication method for forming a semiconductor device having COB (capacitor-over-bit line) structure is provided. A lower insulating film is formed on a substrate. Bit line patterns are formed on a portion of the lower insulating film. Each of the bit line patterns comprises a conductive bit line, a lower capping strip and an upper capping strip, which are sequentially stacked. Mask-defining layer is formed on the other portion of the lower insulating film. The upper capping strips are removed by wet etching technique to form a recess region. The lower capping strips and a portion of the mask-defining layer is etched isotropically to enlarge the recess region. An insulating mask is formed in the enlarged recess region. BC (buried contact) holes are formed substantially in self-aligned manner to the bit lines by using the mask as an etch mask. According to the present invention, the unfavorable electrical contact between the storage electrodes and the bit lines can be significantly relieved.

24 Claims, 14 Drawing Sheets

PRIOR ART

PRIOR ART

SEMICONDUCTOR MEMORY DEVICE HAVING COB STRUCTURE AND METHOD OF FABRICATING THE SAME

This application relies for priority upon Korean Patent Application No. 2001-79690, filed on Dec. 15, 2001, the contents of which are herein incorporated by reference in their entirety.

FIELD OF THE INVENTION

The present invention relates to a semiconductor device and method of fabricating the same, and more specifically, to a dynamic random access memory (DRAM) device having capacitor-over-bit line (COB) structure and method of fabricating the same.

BACKGROUND OF THE INVENTION

Generally, a DRAM unit cell comprises a MOS transistor, a bit line and a storage capacitor. A storage electrode of the storage capacitor is electrically connected to a source electrode of the MOS transistor through a buried contact (BC) hole. The bit line is electrically connected to a drain electrode of the MOS transistor through a direct contact (DC) hole. In case of capacitor-over-bit line (COB) structure, the storage capacitor is formed over the bit line, and the BC hole is formed between the bit line of the cell and the bit line of an adjacent cell. There are two different representative methods in forming the COB structure, as described followings.

In first method, a BC hole is formed separately to the process for forming a capacitor-defining hollow, in which the storage electrode is to be formed. That is to say, a bit line is formed on a lower insulating film. A BC hole is formed by etching a portion of the lower insulating film. The BC hole may be preferably filled by a conductive BC plug. Subsequently, an upper insulating film is formed on the resultant structure. A capacitor-defining hollow is formed by etching a portion of the upper insulating film. A storage electrode is formed in the hollow and electrically connected to an underlying MOS transistor by way of the BC hole.

Meanwhile, in second method, a BC hole is formed continuously to the process for forming a capacitor-defining hollow. That is to say, a bit line is formed on a lower insulating film. An upper insulating film is formed on the bit line. A capacitor-defining hollow is formed by etching a portion of the upper insulating film. A BC hole is formed by etching a portion of the lower insulating film. The etching for forming the BC hole is performed continuously to the etching for forming the hollow.

The first method is more complex than the second one. Moreover, A resistance between the storage electrode and the transistor is unfavorably high in a DRAM unit cells made by the first method compared to the second method. Nevertheless, the first method is more widely adopted in commercial manufacturing field. This is because a misalignment problem, which is described in followings, is known to be more serious in the second method than in the first method.

In the continuing trend to higher memory capacity, it has been constantly needed to reduce the unit cell size of semiconductor devices. In order to decrease the cell size of a DRAM device having COB structure, it is essential to reduce a distance between the BC hole and the DC hole as well as a distance between the BC hole and the bit line. However, the reduced distances may weaken immunity to misalignment during the manufacturing process of the DRAM device, especially in a design rule of 0.2 um or less. The misalignment problem may induce an electrical short (an unfavorable electrical connection) between the storage capacitor and the bit line. The misalignment problem will be described in detail hereinafter with reference to the accompanying drawings.

FIGS. 8a through 8c are for illustrating one example of conventional DRAM devices, which is formed by the second method. FIG. 8a is a schematic plan view illustrating a portion of a unit cell array. FIGS. 8b and 8c are cross-sectional views of FIG. 8a taken along a line 8B–8B' and a line 8C–8C' respectively.

Referring to FIG. 8a through 8c, an isolation region 114 is formed on a semiconductor substrate 110, thereby defining active regions 112 in the substrate 110. The isolation region 114 may be formed by using either LOCOS (Local Oxidation of Silicon) technique or trench technique. For better understanding of the plan view, the active regions 112 and the isolation region 114 are not shown in FIG. 8a. On the resultant structure, a plurality of gate patterns is formed to extend in a first direction. Each of the gate patterns comprises a conductive gate electrode 118, a gate dielectric layer 116, an insulating gate capping layer 120 and insulating gate spacers 122. The gate electrode 118 is formed on the substrate 110. The gate dielectric layer 116 is formed between the gate electrode 118 and the substrate 110. The gate capping layer 120 is formed on the gate electrode 118. The gate spacers 122 are formed on the sidewalls of the gate electrode 118. For better understanding of the plan view, the gate dielectric layer 116, the insulating gate capping layer 120 and the gate spacers 122 are not shown in FIG. 8a. The gate patterns are spaced apart to each other with a constant distance, thereby defining a plurality of spatial lanes therebetween.

An insulating pad-defining layer 125 is formed on the gate patterns and the substrate 110. The pad-defining layer 125 is patterned by photo/etch technique to form a plurality of pad holes, which expose a portion of the active regions 112. Though not shown in the drawings, a conductive pad layer is formed on the pad-defining layer 125 and the exposed portion of the active regions 112. An upper portion of the pad layer and an upper portion of the pad-defining layer 125 are polished out by CMP (Chemical Mechanical Polishing) technique to expose the gate capping layers 120. As a result, either the rows of BC pads 124a or the rows of DC pads 124b are formed on each of the plurality of spatial lanes as shown in the drawings. The rows of the BC pads 124a are formed on every second spatial lane, and the rows of the DC pads 124b are also formed on every second spatial lane. That is to say, the rows of the BC pads 124a and the rows of the DC pads 124b are formed alternatively and one by one on the spatial lanes.

As shown in FIG. 8a, the BC pads 124a are arranged in periodicity in the first direction with a first cyclical distance. Similarly, the DC pads 124b are arranged in periodicity in the first direction with a second cyclical distance. The second cyclical distance is twice the first one. As shown in FIG. 8b, each of the active regions 112 has two of the BC pads 124a and one of the DC pads 124b. The BC pads 124a are located on two ends of the active regions 112. The DC pads 124b are located on the centers of the active regions 112.

A lower insulating film 126 is formed on the BC pads 124a, the DC pads 124b and the gate patterns. The lower insulating film 126 is patterned by photo/etch technique to form a plurality of DC holes, which expose the DC pads 124b. The DC holes are filled with conductive DC plugs 129a.

A plurality of bit line patterns is formed on the lower insulating film 126. Each of the bit line patterns comprises a conductive bit line 129, an insulating bit line capping layer and bit line spacers. The bit line 129 is formed on the lower insulating film. The bit line capping layer is formed on the bit line 129. The bit line spacers are formed on sidewalls of the bit line 129. For better understanding of the drawings, the bit line capping layers and bit line spacers are not shown in the drawings. The bit lines 129 are electrically connected to the corresponding ones of the DC plugs 129a. The plurality of the bit line patterns is extended in a second direction. The second direction is perpendicular to the first direction.

An intermediate insulating film 135 and an upper insulating film 139 are formed on the resultant structure. The upper insulating film 139, the intermediate insulating film 135 and the lower insulating film 126 are patterned sequentially and continuously by photo/etch technique. As a result, a plurality of hollows 141 is formed through the upper insulating film 139, the intermediate insulating film 135 and the lower insulating film 126. Each of the hollows 141 includes an upper hollow and a lower hollow. The upper hollow (i.e., capacitor-defining hollow) is a portion of the hollow that is surrounded by the upper insulating film 139. The lower hollow (i.e., BC hole) is a portion of the hollow that is surrounded by the intermediate insulating film 135 and the lower insulating film 126. The BC holes expose corresponding ones of the BC pads 124a.

Subsequently, storage electrode 143 is formed in each of the hollows by well-known method. The storage electrodes 143 are preferably formed of polysilicon. The storage electrodes 143 are connected to corresponding ones of the BC pads 124a through the BC holes. Though not shown, a capacitor dielectric layer and a plate electrode are formed on the storage electrodes 143.

As described above, the hollows are formed by photo/etch technique. Therefore, the alignment of the photo/etch technique determines distance between the storage electrodes 143 and the DC plugs 129a (denoted by W2) as well as distance between the storage electrodes 143 and the bit lines 129. The distances should be decreased to obtain a high packing density of the devices. However, the deceased distances result in weak immunity to misalignment during the manufacturing process. That is to say, it is very critical to maintain accurate alignment during the process for forming the hollows to prevent the electrical short between the storage capacitor and the bit line. Accordingly, the need for method for forming DRAM devices of COB structure having an increased immunity to misalignment during the manufacturing process remains.

SUMMARY OF THE INVENTION

It is an object of the present invention to provide a method for forming a semiconductor device, wherein immunity to misalignment during the manufacturing process is increased.

It is another object of the present invention to provide a method for forming a semiconductor device having COB structure, wherein the misalignment problem between BC holes and bit lines is significantly relieved compared to the conventional method.

It is another object of the present invention to provide a method for forming a semiconductor device having COB structure, wherein a distance between storage electrodes and DC plugs is increased.

It is another object of the present invention to provide a semiconductor device having COB structure, wherein a distance between storage electrodes and DC plugs is increased so that immunity to misalignment during the manufacturing process is increased.

According to one aspect of the present invention, a method of fabricating a semiconductor device is provided. The method comprises forming first conductive regions and second conductive regions on a substrate. A lower insulating film is formed on the first conductive regions and the second conductive regions. Conductive intermediate strips are formed on a portion of the lower insulating film. Upper capping strips are formed on corresponding ones of the intermediate strips. Lower capping strips are formed between corresponding ones of the intermediate strips and corresponding ones of the upper capping strips. A mask-defining layer is formed on the upper capping strips and the other portion of the lower insulating film. An upper portion of the mask-defining layer is planarized to expose the upper capping strips. The upper capping strips are removed. A portion of the planarized mask-defining layer and the lower capping strips are isotropically and simultaneously etched, thereby forming mask-defining patterns on the other portion of the lower insulating film. Mask-defining patterns overlaps the first conductive regions in plan view. A mask is formed on the intermediate strips to overlap the second conductive regions in plan view. An upper insulating film is formed on the mask-defining patterns and the mask. A portion of the upper insulating film is etched to forming upper hollows, which expose the mask. The mask-defining patterns and the lower insulating film are etched by using the mask as an etch mask to forming lower hollows, which expose the first conductive regions. The diameters of the upper hollows are greater than that of the corresponding ones of the lower hollows.

According to another aspect of the present invention, a method of fabricating a semiconductor device is provided. The method comprises forming a plurality of gate patterns on a substrate. The plurality of gate patterns is extended in a first direction and defines a plurality of spatial lanes therebetween. Either buried contact pads or direct contact pads are formed on each of the spatial lanes. The rows of the buried contact pads are formed on every second spatial lane. The rows of the direct contact pads are formed on every second spatial lane. A lower insulating film is formed on the buried contact pads, the direct contact pads and the gate patterns. A plurality of bit line patterns is formed on the lower insulating film. Each of the bit line patterns comprises a conductive bit line, a lower capping strip and an upper capping strip. The conductive bit line is formed on the lower insulating film. A lower capping strip is formed on the bit line. An upper capping strip is formed on the lower capping strip. The plurality of bit line patterns is extended in a second direction. The second direction is perpendicular to the first direction. The bit line patterns have a first width over the spatial lanes, on which the buried contact pads are formed. The bit line patterns have a second width over the spatial lanes, on which the direct contact pads are formed. The second width is greater than the first width. A mask-defining layer is formed on the bit lines patterns and the lower insulating film. The mask-defining layer is planarized to expose the upper capping strips. The exposed upper capping strips are removed. The lower capping strips and a portion of the planarized mask-defining layer are isotropically etched, thereby exposing the bit lines and forming mask-defining patterns on the lower insulating film. An insulating mask is formed on the bit lines. An upper insulating film is formed on the mask and the mask-defining patterns. A portion of the upper insulating film is etched to form upper hollows therethrough. The mask-defining patterns and the lower insulating film are etched by using the mask as an etch mask, thereby forming lower hollows therethrough and exposing the buried contact pads. Storage electrodes are formed in corresponding ones of the hollows. The storage electrodes are electrically connected to the corresponding ones of the exposed buried contact pads.

According to another aspect of the present invention, a semiconductor device is provided. The semiconductor device comprises first conductive regions and second conductive regions on a substrate. A lower insulating film is formed on the substrate. Intermediate strips are formed on a portion of the lower insulating film. Mask-defining patterns are formed on the other portion of the lower insulating film. A mask is formed on the intermediate strips. The mask overlaps the second conductive regions in plan view. An upper insulating film is formed on the mask. Hollows are formed through the upper insulating film, the lower insulating film and the mask-defining patterns. The hollows expose the first conductive regions. Each of the hollows comprises a lower hollow, an upper hollow and an intermediate hollow. The mask surrounds the intermediate hollow. The diameter of the intermediate hollow is decreased gradually in a direction to the substrate. The diameter of the upper hollow is greater than that of the lower hollow. The mask is formed of an insulating material. The mask is preferably formed of silicon nitride. The lower and upper insulating films are formed of silicon oxide. The width of the mask is decreased gradually in direction to the substrate.

BRIEF DESCRIPTION OF THE DRAWINGS

Other features of the present invention will be more readily understood from the following detail description of specific embodiment thereof when read in conjunction with the accompanying drawings, in which:

FIGS. 1a through 7a are schematic plan views illustrating successive process steps for forming a portion of a unit cell array in a DRAM device according to a preferred embodiment of the present invention;

DESCRIPTION OF THE PREFERRED EMBODIMENT

Figure 1A:
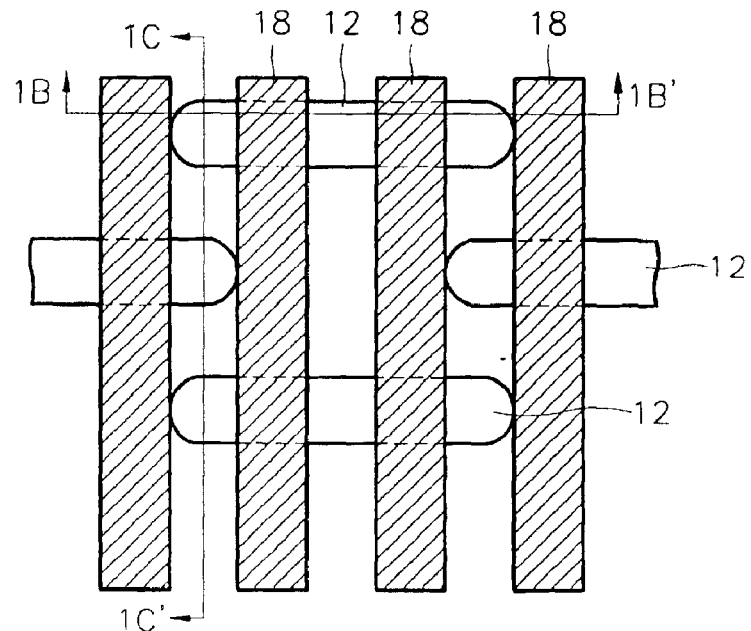

Preferred embodiments of the present invention will be described hereinafter with reference to the accompanying drawings, even though the scope of the present invention is not limited to the embodiments. In drawings, the geometrical magnitude of elements may be exaggerated for clarity. Like reference numerals in the drawings denote the same members.

FIGS. 1a through 7a are schematic plan views illustrating successive process steps for forming a portion of a unit cell array in a DRAM device according to a preferred embodiment of the present invention. FIGS. 1b through 7b, 1c through 7c and 7d are cross-sectional views of the schematic plan views.

Figure 1B:
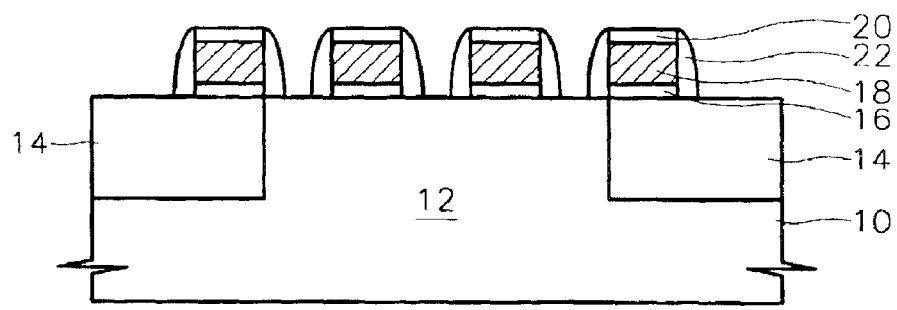
FIGS. 1b and 1c are cross-sectional views of FIG. 1a taken along a line 1B–1B' and a line 1C–1C' respectively.
Figure 1C:
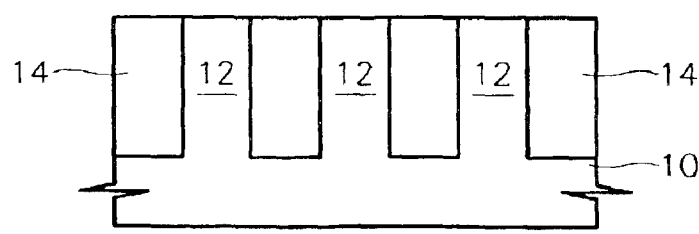

FIGS. 1b and 1c are cross-sectional views of FIG. 1a taken along a line 1B–1B' and a line 1C–1C' respectively. Referring to FIGS. 1a, 1b and 1c, an isolation region 14 is formed on a semiconductor substrate 10 by using trench technique, thereby defining active regions 12 in the substrate 10. The isolation region 14 may also be formed by using LOCOS technique. Though not shown, the active regions 12 may be formed within well regions that are formed in the substrate 10. Though not shown, impurity doped regions may be formed in the active regions 12 by ion implantation of n-type or p-type impurities.

On the resultant structure, a plurality of gate patterns is formed to extend in a first direction. Each of the gate patterns comprises a conductive gate electrode 18 formed of polysilicon, a gate dielectric layer 16 formed of silicon oxide, an insulating gate capping layer 20 formed of silicon nitride and insulating gate spacers 22 formed of silicon nitride. The gate electrode 18 is formed on the substrate 10. The gate dielectric layer 16 is formed between the gate electrode 18 and the substrate 10. The gate capping layer 20 is formed on the gate electrode 18. The gate spacers 22 are formed on the sidewalls of the gate electrode 18. For better understanding, the gate dielectric layer 16, the insulating gate capping layer 20 and the gate spacers 22 are not shown in the plan views. The gate patterns are spaced apart to each other with a constant distance, thereby defining a plurality of spatial lanes therebetween. The gate electrodes 18 act as word lines during the operation of the device.

Figure 2A:
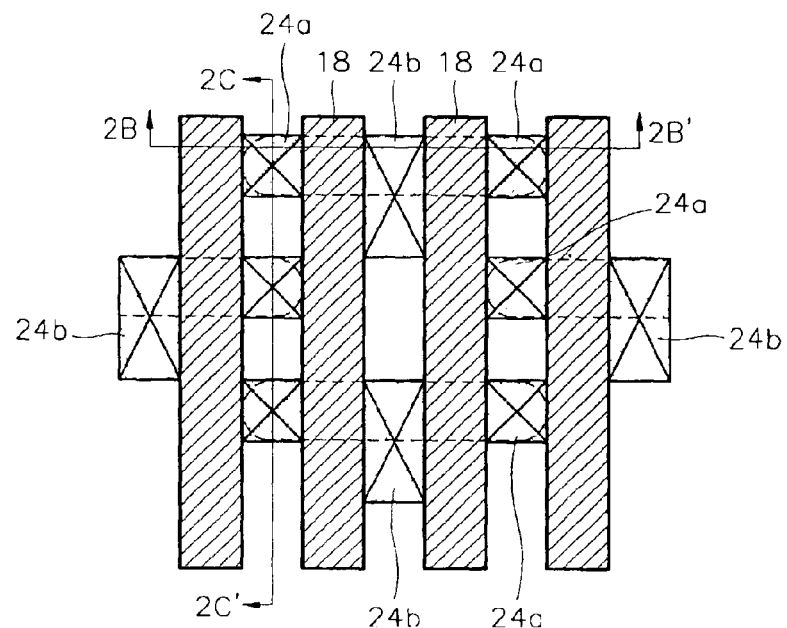
Figure 2B:
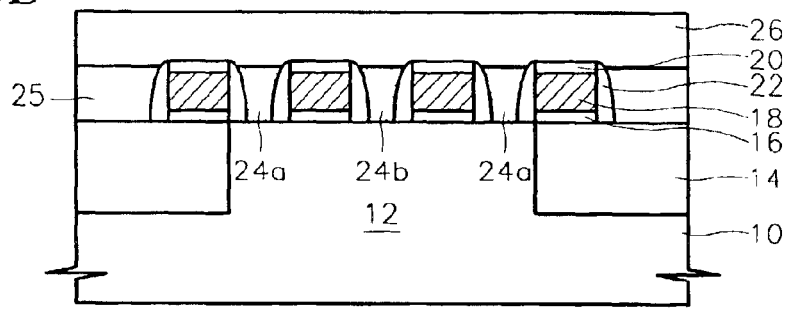
FIGS. 2b and 2c are cross-sectional views of FIG. 2a taken along a line 2B–2B' and a line 2C–2C' respectively.
Figure 2C:
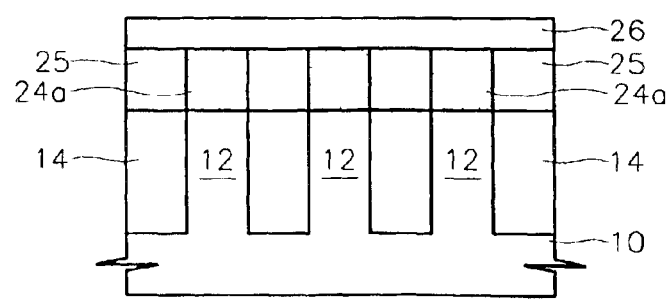

FIGS. 2b and 2c are cross-sectional views of FIG. 2a taken along a line 2B–2B' and a line 2C–2C' respectively. Referring to FIGS. 2a, 2b and 2c, an insulating pad-defining layer 25 is formed on the gate patterns and the substrate 10. The pad-defining layer 25 is preferably formed of silicon oxide. The pad-defining layer 25 is patterned by photo/etch technique to form a plurality of pad holes. The pad holes expose a portion of the active regions 12 and a portion of the isolation region 14. The etching for forming the pad holes may be performed in self-aligned manner to the gate patterns, because the etch rate of the pad-defining layer 25 is significantly greater than those of the gate capping layers 20 and the gate spacers 22 under a selected etching condition. A conductive pad layer (not shown in the drawings) is formed on the pad-defining layer 25 and the exposed portion of the active regions 12 to fill the pad holes. An upper portion of the pad layer and an upper portion of the pad-defining layer 25 are polished out flatly by CMP (Chemical Mechanical Polishing) technique to expose the gate capping layers 20. As a result, either the rows of first conductive regions 24a or the rows of second conductive regions 24b are formed on each of the plurality of spatial lanes as shown in the drawings. Subsequently, a lower insulating film 26 is formed on the BC pads 24a, the DC pads 24b and the gate patterns. The lower insulating film 26 is preferably formed of silicon oxide.

In this embodiment of the present invention, the first conductive regions 24a are BC pads, and the second conductive regions 24b are DC pads. The rows of the BC pads 24a are formed on every second spatial lane, and the rows of the DC pads 24b are also formed on every second spatial lane. That is to say, the rows of the BC pads 24a and the rows of the DC pads 24b are formed alternatively and one by one on the spatial lanes. As shown in FIG. 1a, the BC pads 24a and the DC pads 24b are arranged in periodicity in the first direction with a first and a second cyclical distance respectively. The second cyclical distance is twice the first one. As shown in FIG. 1b, each of the active regions 12 has two of the BC pads 24a and one of the DC pads 24b. The BC pads 24a are located on two ends of the active regions 12. The DC pads 24b are located on the centers of the active regions 12 and an adjacent portion of the isolation region 14. The BC pads 24a and the DC pads 24b are electrically isolated from the gate electrodes 18 by the gate spacers 22.

Figure 3A:
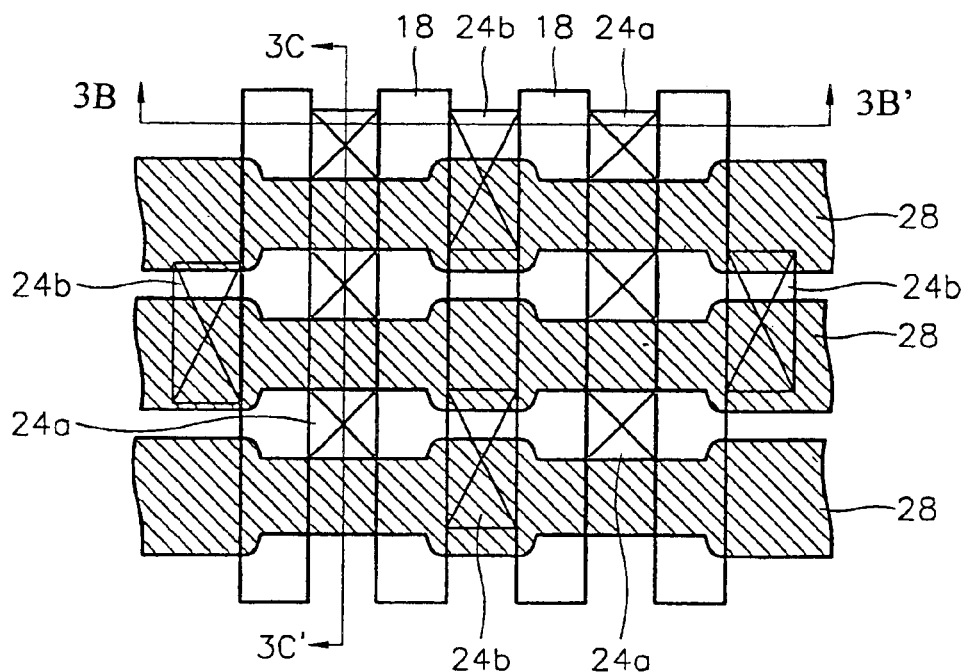
Figure 3B:
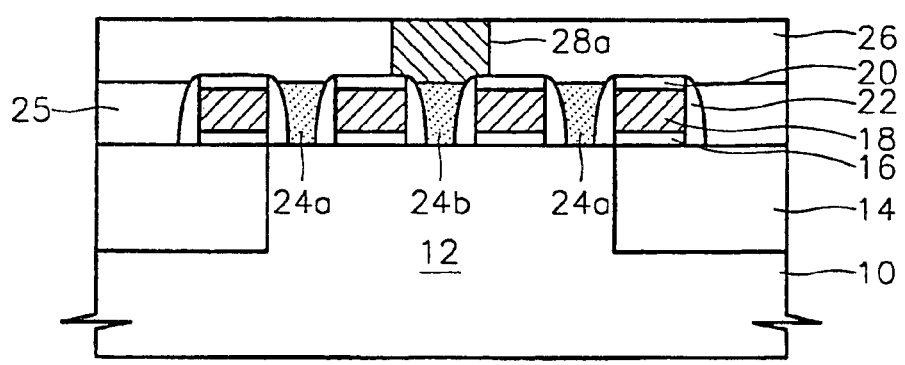
FIGS. 3b and 3c are cross-sectional views of FIG. 3a taken along a line 3B–3B' and a line 3C–3C' respectively.
Figure 3C:
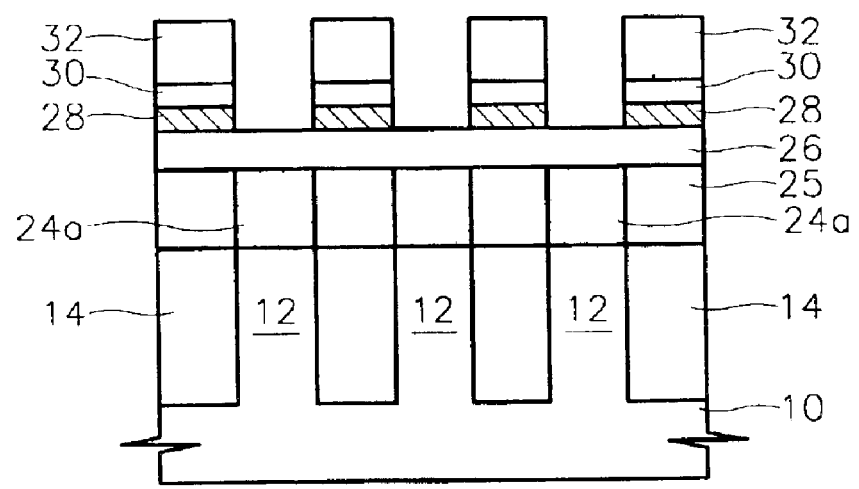

FIGS. 3b and 3c are cross-sectional views of FIG. 3a taken along a line 3B–3B' and a line 3C–3C' respectively. Referring to FIGS. 3a, 3b and 3c, the lower insulating film 26 is patterned by photo/etch technique to form a plurality of DC holes, which expose the DC pads 24b. The DC holes are filled by conductive DC plugs 28a. Subsequently, a conductive intermediate layer, a lower capping layer and an upper capping layer are stacked sequentially on the lower insulating film 26. The material of the lower capping layer preferably has a significantly lower etch rate than that of the material of the upper capping layer under the process condition of a first wet etching, which is to be performed later process step. The lower capping layer and the upper capping layer are preferably formed of silicon oxide and silicon nitride respectively.

The intermediate layer, the lower capping layer and the upper capping layer are patterned continuously by photo/etch technique to form a plurality of intermediate patterns on the lower insulating film 26. Each of intermediate patterns is comprises an intermediate strip 28, a lower capping strip 30 and an upper capping strip 32, which are formed by the patterning of the intermediate layer, the lower capping layer and the upper capping layer respectively. In this embodiment of the present invention, the intermediate strips 28 and intermediate patterns are bit lines and bit line patterns respectively. For better understanding of the drawings, the lower capping strips 30 and the upper capping strips 32 are not shown in the plan views. The bit lines 28 are electrically connected to the corresponding ones of the DC plugs 28a.

The plurality of bit line patterns is extended in a second direction. The second direction is perpendicular to the first direction. The bit line patterns have a first width and a second width. The bit line patterns have the first width over the spatial lanes, on which the BC pads 24a are formed. And, the bit line patterns have the second width over the spatial lanes, on which the DC pads 24b are formed. The second width is greater than the first width. The second width is preferably 20~30 nm greater than the first width.

In modified version of this embodiment of the present invention, the process for forming the conductive plugs may not be performed. That is to say, the DC holes may be filled by the intermediate layer so that the intermediate layer directly contact the DC pads 24b.

Figure 4A:
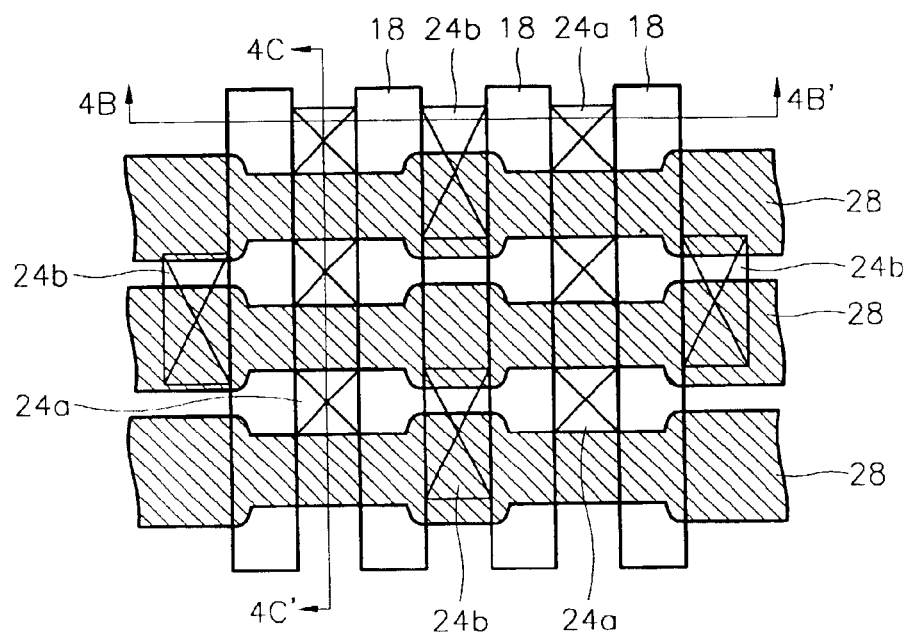
Figure 4B:
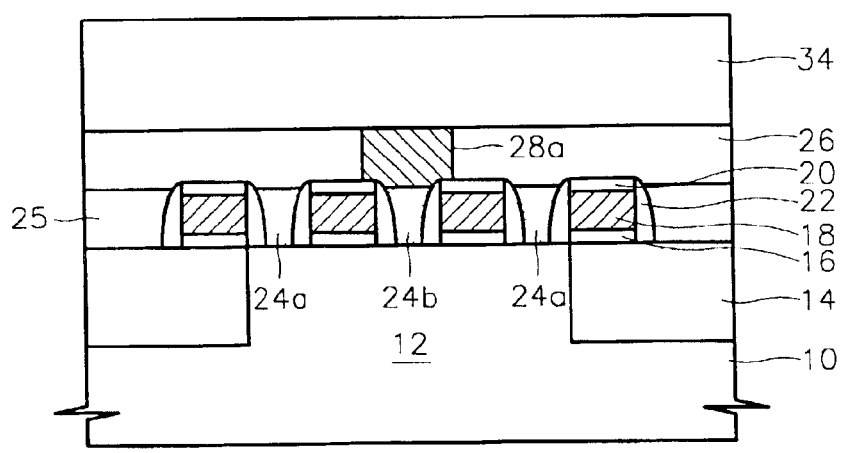
FIGS. 4b and 4c are cross-sectional views of FIG. 4a taken along a line 4B–4B' and a line 4C–4C' respectively.
Figure 4C:
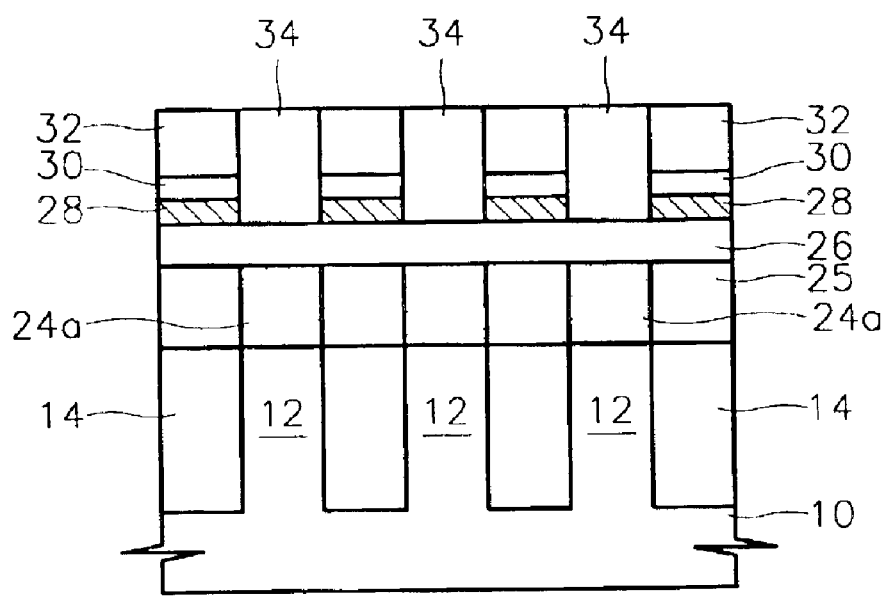

FIGS. 4b and 4c are cross-sectional views of FIG. 4a taken along a line 4B–4B' and a line 4C–4C' respectively. Referring to FIGS. 4a, 4b and 4c, a mask-defining layer 34 is formed on the upper capping strips 32 and the lower insulating film 26. The material of the mask-defining layer 34 preferably has a significantly lower etch rate than that of the material of the upper capping layer under the first wet etching condition. The material of the mask-defining layer 34 may be same as that of the lower capping layer. The mask-defining layer 34 is preferably formed of silicon oxide. An upper portion of the mask-defining layer 34 is removed and planarized by CMP or etch back technique to expose the upper capping strips 32.

Figure 5A:
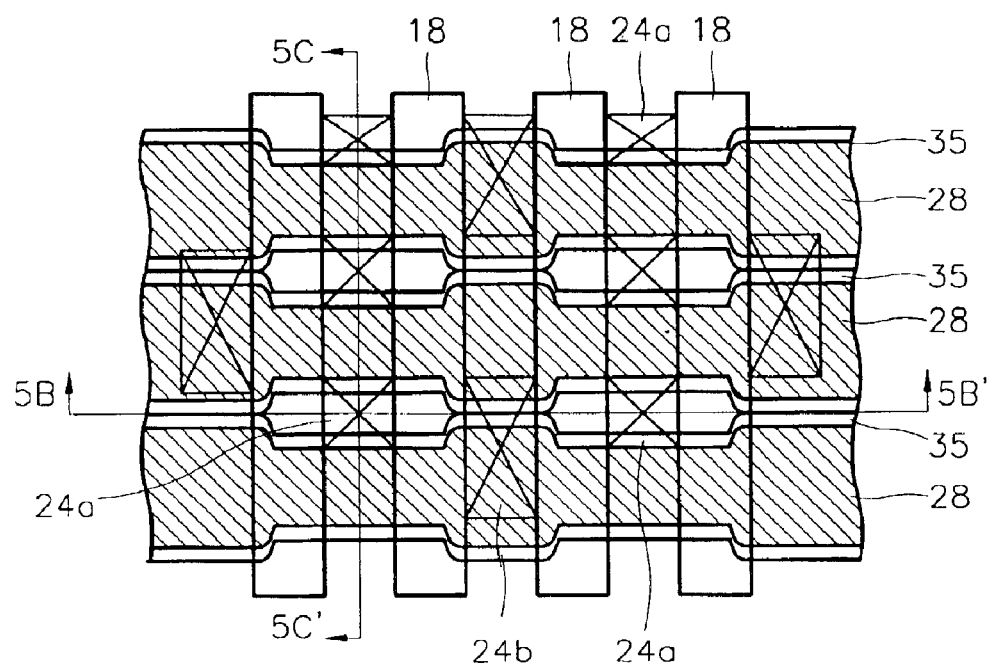
Figure 5B:
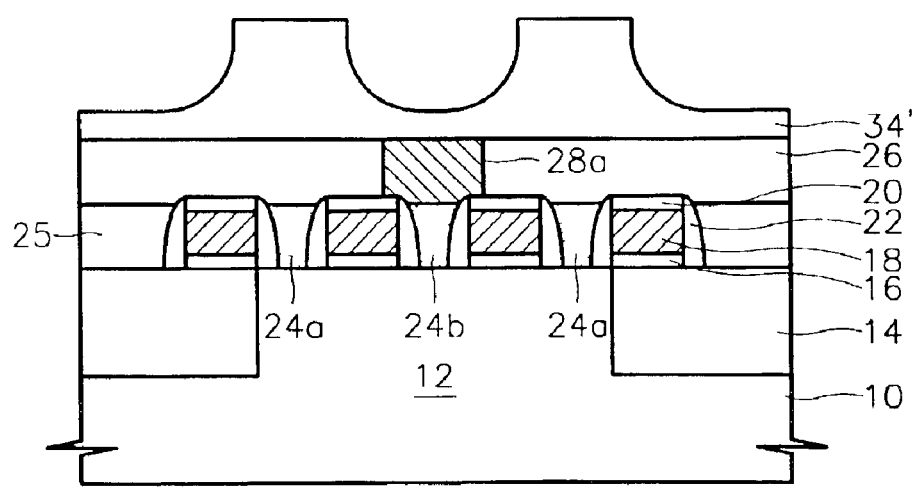
FIGS. 5b and 5c are cross-sectional views of FIG. 5a taken along a line 5B–5B' and a line 5C–5C' respectively.
Figure 5C:
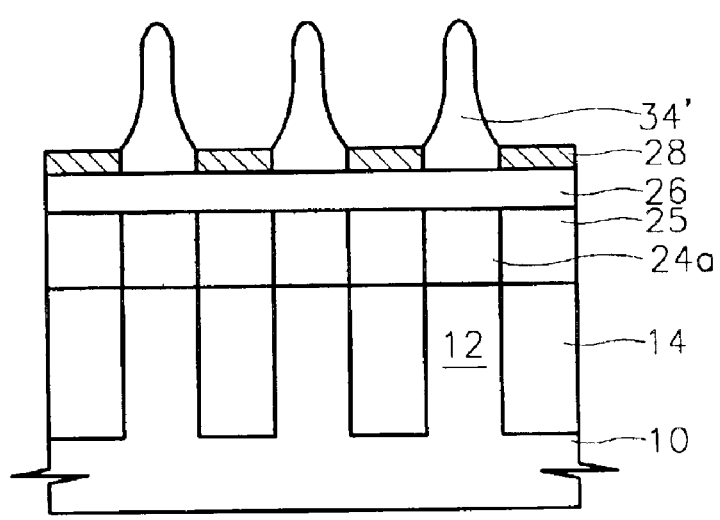

FIGS. 5b and 5c are cross-sectional views of FIG. 5a taken along a line 5B–5B' and a line 5C–5C' respectively. Referring to FIGS. 5a, 5b and 5c, the upper capping strips 32 are selectively removed under the first wet etching condition, thereby exposing the lower capping strips 30 and forming a recess region defined by the planarized mask-defining layer 34. The first wet etching is performed preferably by using phosphoric acid as an etchant. A portion of the planarized mask-defining layer 34 and the lower capping strips 30 are isotropically and simultaneously removed by a second wet etching condition, thereby exposing the bit lines 28 and enlarging the recess region. As a result, mask-defining patterns 34' are formed on the lower insulating film 26.

The mask-defining patterns 34' overlap the BC pads 24a in plan view. In FIG. 5a, reference number 35 denotes the enlarged recess region. As shown in the plan view, the enlarged recess region 35 completely overlaps the spatial lanes, on which the DC pads 24b are formed. However, the completely overlapping may not be required. That is to say, the enlarged recess region 35 may overlap only the DC pads 24b and the bit lines 28 in plan view. The process time in the first wet etching condition can be adjusted to determine the underlying structure, which is overlapped by the enlarged recess region 35.

Figure 6A:
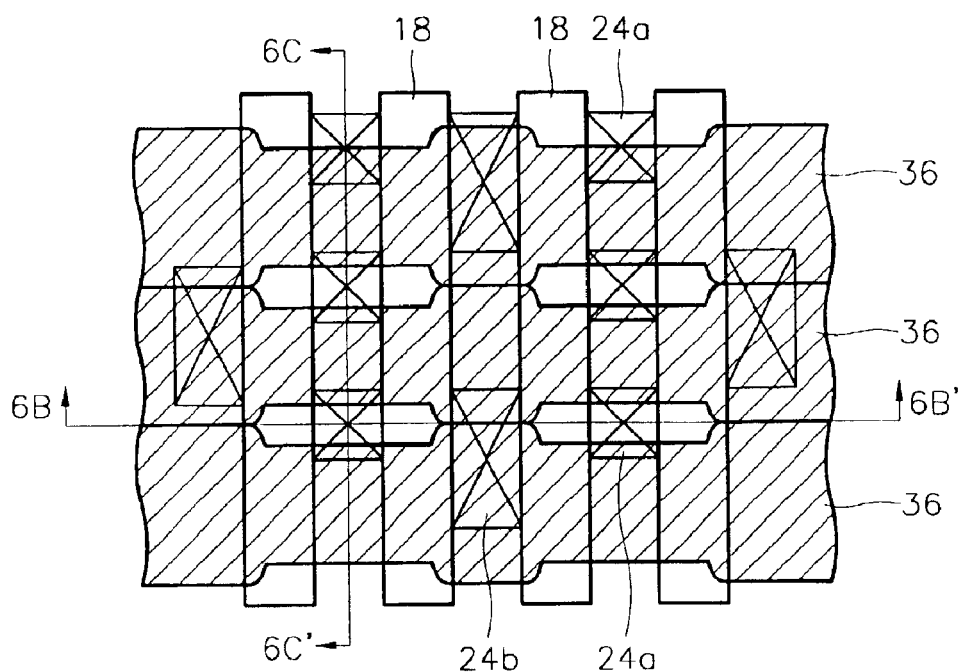
Figure 6B:
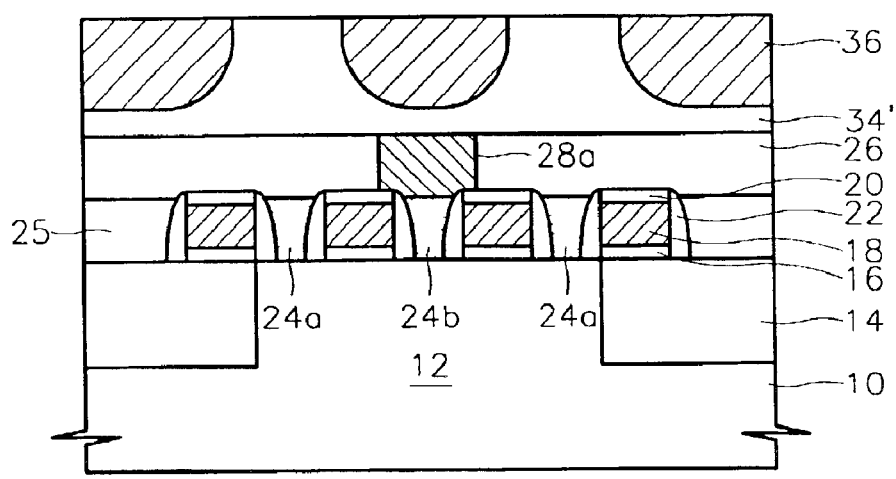
FIGS. 6b and 6c are cross-sectional views of FIG. 6a taken along a line 6B–6B' and a line 6C–6C' respectively.
Figure 6C:
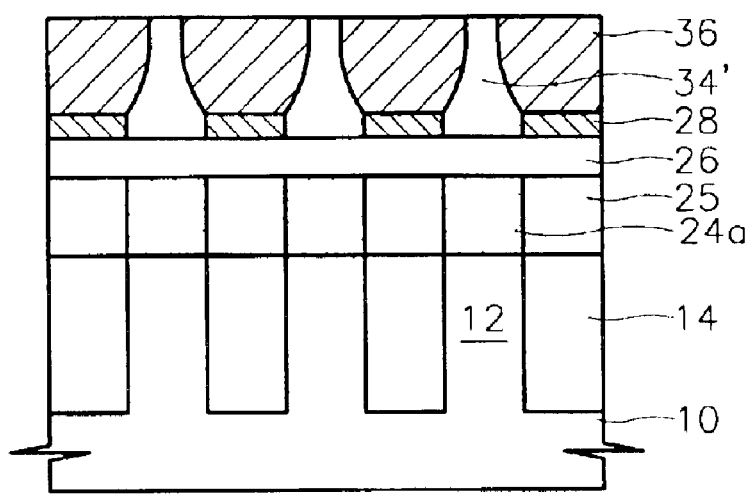

FIGS. 6b and 6c are cross-sectional views of FIG. 6a taken along a line 6B–6B' and a line 6C–6C' respectively. Referring to FIGS. 6a, 6b and 6c, a mask layer (not shown) is formed on the bit lines 28 and the mask-defining patterns 34', thereby fill the enlarged recess region 35. The material of the mask layer has a significantly lower etch rate than that of the mask-defining patterns 34' under a selected dry etching condition. The mask layer is preferably formed of electrically insulating material such as silicon nitride.

Subsequently, an upper portion of the mask layer is removed and planarized by CMP technique to expose the mask-defining patterns 34' and form mask 36 in the enlarged recess region 35. The mask 36 completely overlaps the DC pads 24b and the bit lines 28 in plan view. As shown in the drawings, the width of the mask 36 is decreased gradually in direction to the substrate 10. This is because of the inherent isotropical characteristics of the second wet etching.

As shown in FIG. 6a, the mask 36 completely overlaps the spatial lanes, on which the DC pads 24b are formed. However, in case that the enlarged recess region 35 dose not completely overlap the spatial lanes, on which the DC pads 24b are formed, and overlaps only the DC pads 24b and the bit lines 28 in plan view, the mask 36 may be a plurality of mask strips, which are extended in the second direction.

Figure 7A:
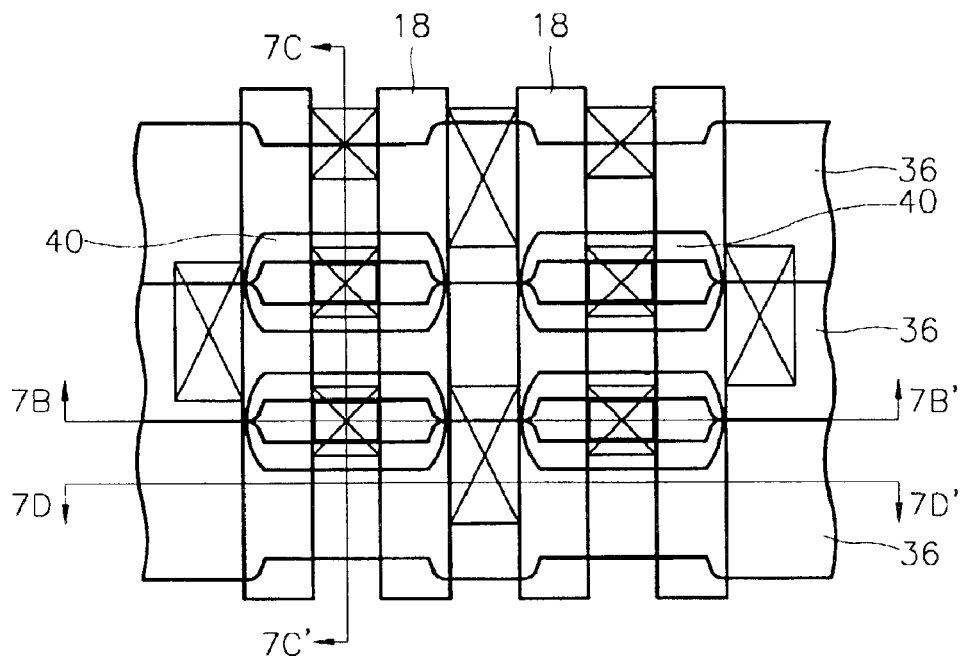
Figure 7B:
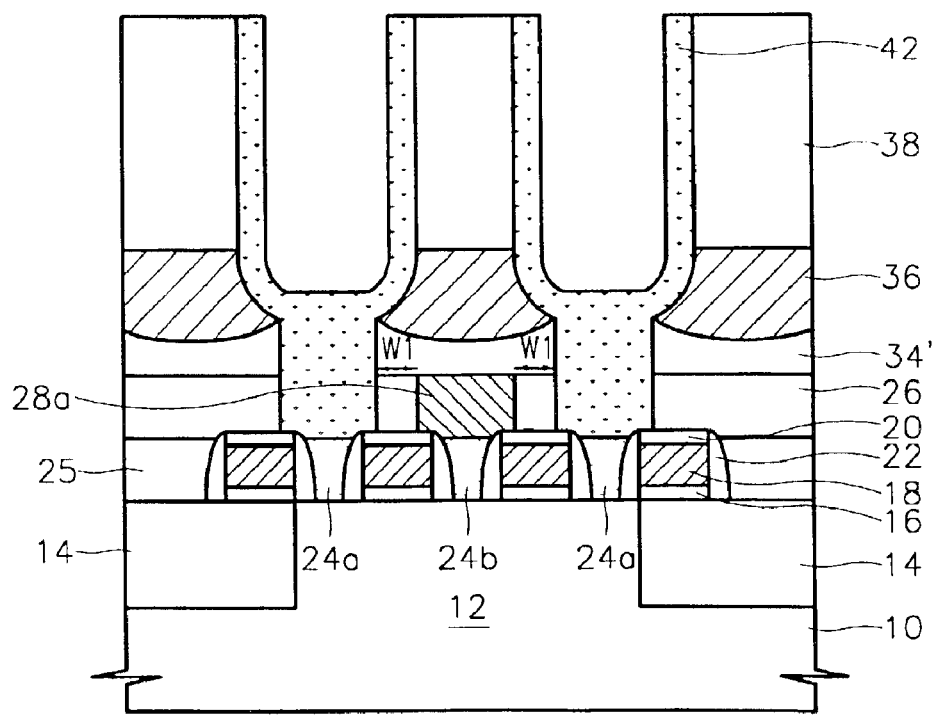
FIGS. 7b, 7c and 7d are cross-sectional views of FIG. 7a taken along a line 7B–7B', a line 7C–7C' and a line 7D–7D' respectively.
Figure 7C:
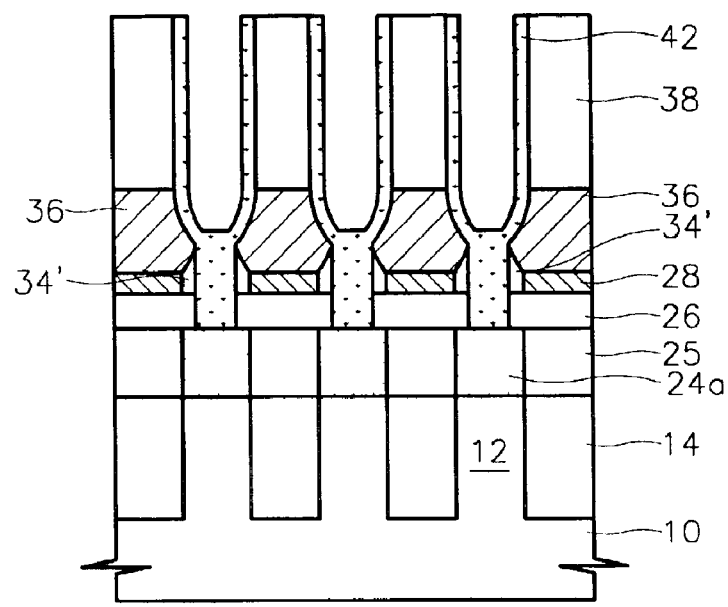
Figure 7D:
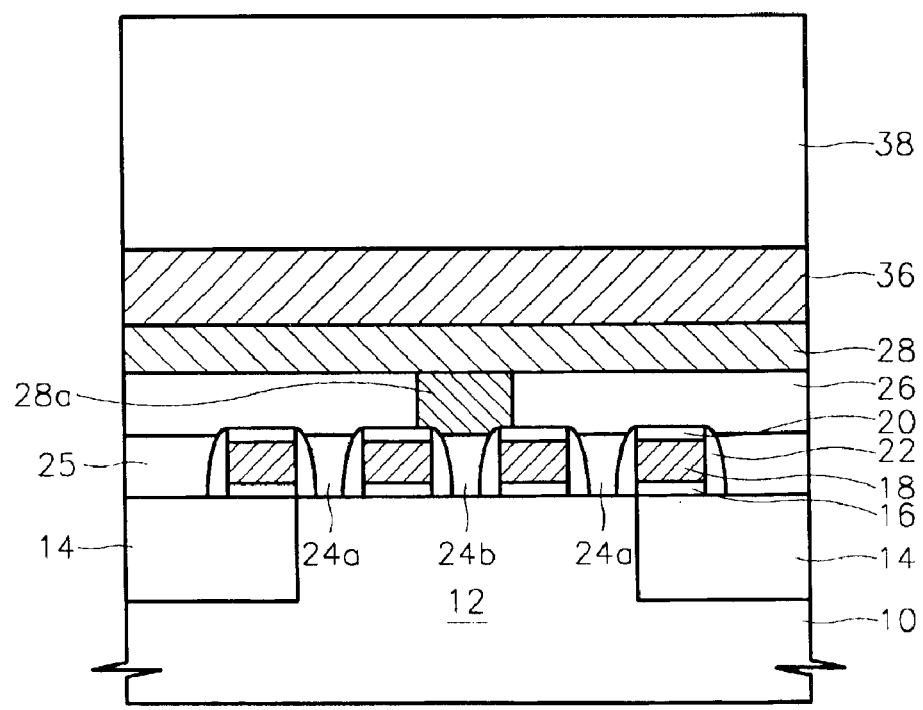
Figure 8A:
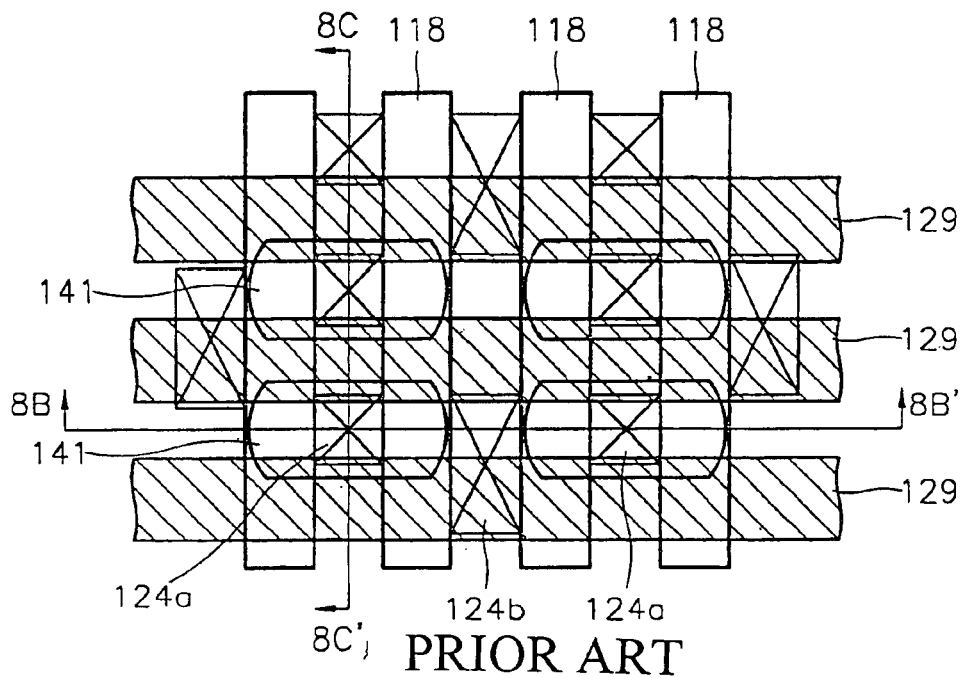
FIG. 8a is a schematic plan view for illustrating one example of conventional DRAM device.
Figure 8B:
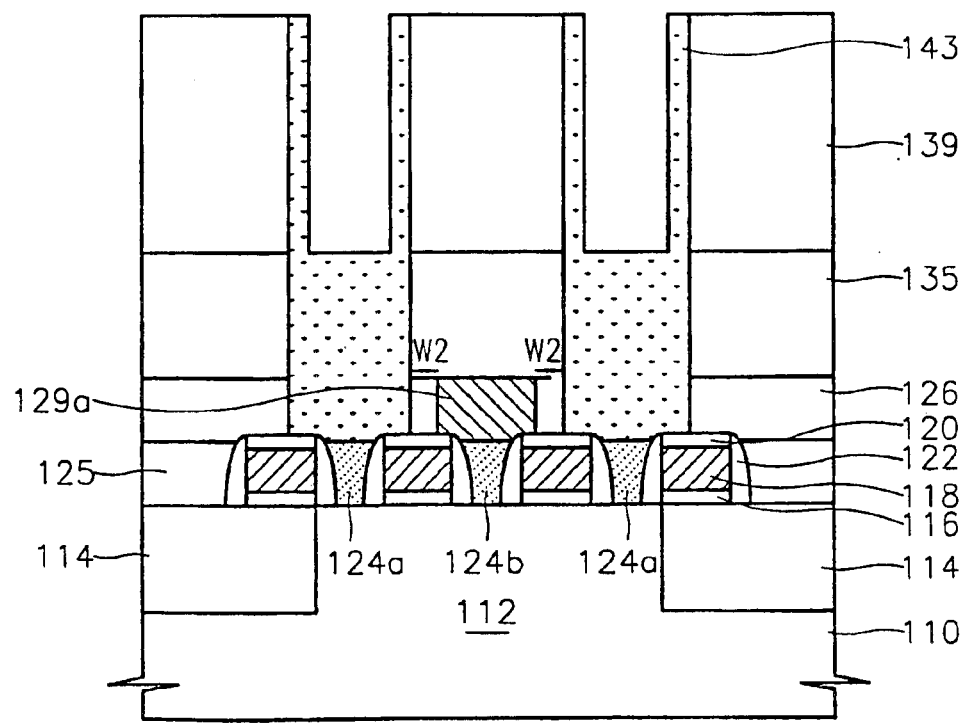
FIGS. 8b and 8c are cross-sectional views of FIG. 8a taken along a line 8B–8B' and a line 8C–8C' respectively.
Figure 8C:
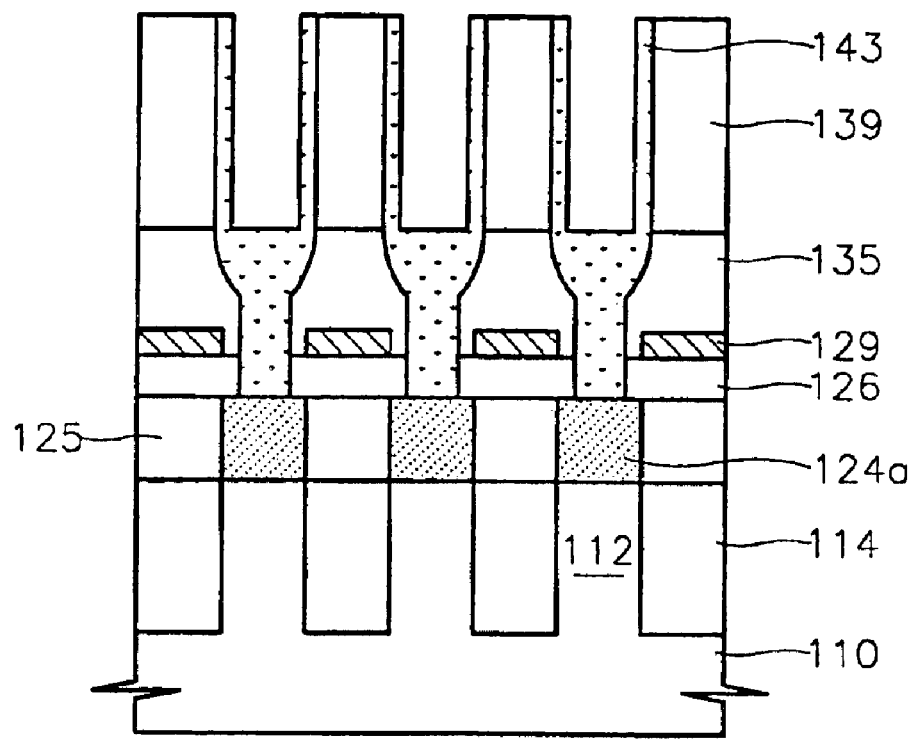

FIGS. 7b, 7c and 7d are cross-sectional views of FIG. 7a taken along a line 7B–6B', a line 7C–7C' and a line 7D–7D' respectively. Referring to FIGS. 7a, 7b, 7c and 7d, an upper insulating film 38 is formed on the resultant structure. The upper insulating film 38 is preferably formed of silicon oxide. On the upper insulating film 38, a photoresist pattern is formed. The photoresist pattern has a plurality of openings 40. The photoresist pattern is not shown in FIG. 7b, 7c and 7d for better understanding.

The upper insulating film 38, the mask-defining patterns 34' and the lower insulating film 26 are etched continuously under the selected dry etching condition, thereby forming hollows. Each of the hollows comprises lower, intermediate and upper hollows. The etching for forming the hollows is performed by using the photoresist pattern as an etch mask. In detail, the upper insulating film 38 is etched to expose the mask 36 in first, thereby forming upper hollows through the upper insulating film 38. Continuously, the mask-defining patterns 34' and the lower insulating film 26 are etched to form intermediate hollows and lower hollows. During the etching for forming the intermediate hollows and the lower hollows, the mask 36 also plays a role of another etch mask. The intermediate hollows are surrounded by the mask 36. The lower hollows are surrounded by the mask-defining patterns 34' and the lower insulating film 26. The lower hollows expose the BC pads 24a. In this embodiment of the present invention, the lower hollows are BC holes.

The upper hollows have a greater diameter than the lower hollows, and the diameter of the intermediate hollows is decreased gradually in direction to the substrate 10. This is because the material of the mask 36 has a significantly lower etch rate than that of the mask-defining patterns 34' under the selected dry etching condition.

Subsequently, storage electrode 43 is formed in each of the hollows by well-known method. The storage electrodes 43 are preferably formed of polysilicon. The storage electrodes 43 are connected to corresponding ones of the BC pads 24a through the BC holes. Though not shown, a capacitor dielectric layer and plate electrode are formed on the storage electrodes 43.

As described above, the mask 36 substantial determines the diameter and the location of the lower hollows (i.e., BC holes). In other words, the lower hollows are formed in self-aligned manner to the mask 36. On the other hand, the bit line patterns substantially determine the location of the enlarged recess region or the mask 36. In other words, the mask 36 is formed in self-aligned manner to the bit lines 28. Consequently, the lower hollows are formed substantially in self-aligned manner to the bit lines 28. Therefore, the misalignment problem between the BC holes (i.e., storage electrodes 43) and the bit lines is significantly relieved compared to the conventional method.

Moreover, the diameter of the lower hollows is reduced by the mask 36 compared to the conventional DRAM device. The reduced diameter of the lower hollows means that a distance between the storage electrodes 43 and the DC plugs 28a (denoted by W1) is increased. Therefore, the unfavorable electrical contact between the storage electrodes 43 and the DC plugs 28a can be significantly avoided.

In the drawings and specification, there have been disclosed typical preferred embodiments of the invention. Although specific terms are employed, they are used in a generic and descriptive sense only and not for purpose of limitation. It will be understood by those skilled in the art that various changes in the embodiments may be made without departing from the spirit and scope of the invention.

What is claimed is:

1. A method of fabricating a semiconductor device, comprising:

forming first conductive regions and second conductive regions on a substrate;

forming a lower insulating film on the first conductive regions and the second conductive regions;

forming conductive intermediate strips on a portion of the lower insulating film;

forming mask-defining patterns on the other portion of the lower insulating film to overlap the first conductive regions in plan view, wherein forming mask-defining patterns comprises:

forming upper capping strips on corresponding ones of the intermediate strips;

forming a mask-defining layer on the upper capping strips and the other portion of the lower insulating film;

planarizing an upper portion of the mask-defining layer to expose the upper capping strips;

removing the upper capping strips; and isotropically etching a portion of the planarized mask-defining layer;

forming a mask on the intermediate strips to overlap the second conductive regions in plan view; and etching the mask-defining patterns and the lower insulating film by using the mask as an etch mask to form lower hollows which expose the first conductive regions.

2. The method of claim 1, wherein the removing of the upper capping strips is performed by a wet etching, and wherein the upper capping strips have a higher etch rate than the mask-defining layer for the wet etching.

3. The method of claim 1, wherein the forming a mask comprises:

forming a mask layer on the intermediate strips and the mask-defining patterns; and planarizing an upper portion of the mask layer to expose the mask-defining patterns.

4. The method of claim 1, wherein the mask is formed of an electrically insulating material, and wherein the mask has a lower etch rate than the mask-defining patterns for the etching for forming the lower hollows.

5. The method of claim 1, which further comprises:

forming lower capping strips between corresponding ones of the intermediate strips and corresponding ones of the upper capping strips; and isotropically etching the lower capping strips subsequent to the removing of the upper capping strips.

6. The method of claim 5, wherein the isotropic etching of the lower capping strips and the isotropic etching of the portion of the planarized mask-defining layer are performed simultaneously.

7. The method of claim 5, wherein the material of the lower capping strips is the same as that of the mask-defining layer.

8. The method of claim 1, which further comprises:

forming an upper insulating film on the mask-defining patterns and the mask; and etching a portion of the upper insulating film to forming upper hollows, which expose the mask.

9. The method of claim 8, wherein the diameters of the upper hollows are greater than that of the corresponding ones of the lower hollows.

10. The method of claim 8, wherein the etching for forming the lower hollows is performed continuously to the etching for forming the upper hollows.

11. The method of claim 1, wherein the forming of first conductive regions and second conductive regions comprises:

forming gate patterns on a substrate, wherein the gate patterns are extended in a first direction and define spatial lanes therebetween; and forming either first conductive regions or second conductive regions on each of the spatial lanes, wherein rows of the first conductive regions are formed on every second spatial lane, wherein rows of the second conductive regions are formed on every second spatial lane.

12. The method of claim 11, wherein the first conductive regions are buried contact pads and the second conductive regions are direct contact pads.

13. The method of claim 11, wherein the intermediate strips are extended in a second direction, wherein the second direction is perpendicular to the first direction.

14. The method of claim 13, wherein the intermediate strips have a first width over the spatial lanes on which the first conductive regions are formed, and wherein the intermediate strips have a second width over the spatial lanes, on which the second conductive regions are formed, and wherein the second width is greater than the first width.

15. A method of fabricating a semiconductor device, comprising:

forming a plurality of gate patterns on a substrate, wherein the plurality of gate patterns is extended in a first direction and defines a plurality of spatial lanes therebetween;

forming rows of buried contact pads and direct contact pads on the spatial lanes, wherein the rows of the buried contact pads are formed on every second spatial lane, and wherein the rows of the direct contact pads are formed on every second spatial lane;

forming a lower insulating film on the buried contact pads, the direct contact pads and the gate patterns; and forming a plurality of bit line patterns on the lower insulating film, wherein the plurality of bit line patterns is extended in a second direction, wherein the bit line patterns have a first width over the spatial lanes on which the buried contact pads are formed, wherein the bit line patterns have a second width over the spatial lanes on which the direct contact pads are formed, and wherein the second width is greater than the first width.

16. The method of claim 15, wherein each of the bit line patterns comprises:

a conductive bit line formed on the lower insulating film;

a lower capping strip formed on the bit line; and an upper capping strip formed on the lower capping strip.

17. The method of claim 16, which further comprises:

forming a mask-defining layer on the bit lines patterns and the lower insulating film;

planarizing the mask-defining layer to expose the upper capping strips;

removing the exposed upper capping strips;

isotropically etching the lower capping strips and a portion of the planarized mask-defining layer, thereby exposing the bit lines and forming mask-defining patterns on the lower insulating film;

forming an insulating mask on the bit lines;

forming an upper insulating film on the insulating mask and the mask-defining patterns;

etching a portion of the upper insulating film to form upper hollows therethrough;

etching the mask-defining patterns and the lower insulating film by using the insulating mask as an etch mask, thereby forming lower hollows through the lower insulating film and exposing the buried contact pads; and forming storage electrodes in corresponding ones of the hollows, wherein the storage electrodes are electrically connected to the corresponding ones of the exposed buried contact pads.

18. The method of claim 17, wherein the material of the mask-defining layer is same as that of the lower capping strips.

19. The method of claim 17, wherein the planarizing of the mask-defining layer is performed by CMP technique.

20. The method of claim 17, wherein the removing of the exposed upper capping strips is performed by a wet etching.

21. The method of claim 17, wherein the insulating mask overlaps the direct contact pads in plan view.

22. The method of claim 17, wherein the insulating mask completely overlaps the spatial lanes, on which the rows of the direct contact pads in plan view are formed.

23. The method of claim 17, wherein the mask-defining patterns overlaps the buried contact pads in plan view.

24. The method of claim 17, wherein the forming an insulating mask comprises:

forming a mask layer on the mask-defining patterns and the bit line, wherein the mask layer has low etch rate under an etching condition for forming the lower hollows; and removing an upper portion of the mask layer to expose the mask-defining patterns.

* * * * *

UNITED STATES PATENT AND TRADEMARK OFFICE
CERTIFICATE OF CORRECTION

PATENT NO.        : 6,864,179 B2                                       Page 1 of 1
APPLICATION NO. : 10/198002
DATED             : March 8, 2005
INVENTOR(S)      : Park It is certified that error appears in the above-identified patent and that said Letters Patent is hereby corrected as shown below:

Column 10, line 50, please replace "forming" with --form--

Column 12, line 39, please replace "has low" with --has significantly low--

Signed and Sealed this

Second Day of January, 2007

JON W. DUDAS
*Director of the United States Patent and Trademark Office*